United States Patent
Koyanagi

(10) Patent No.: US 10,916,679 B2
(45) Date of Patent: Feb. 9, 2021

(54) OPTICAL DEVICE WAFER PROCESSING METHOD

(71) Applicant: DISCO CORPORATION, Tokyo (JP)

(72) Inventor: Tasuku Koyanagi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/546,955

(22) Filed: Aug. 21, 2019

(65) Prior Publication Data

US 2020/0075796 A1 Mar. 5, 2020

(30) Foreign Application Priority Data

Aug. 28, 2018 (JP) ................................. 2018-159593

(51) Int. Cl.
*H01L 33/00* (2010.01)

(52) U.S. Cl.
CPC ........ *H01L 33/0093* (2020.05); *H01L 33/007* (2013.01); *H01L 33/0095* (2013.01)

(58) Field of Classification Search
None
See application file for complete search history.

(56) References Cited

U.S. PATENT DOCUMENTS

2007/0298587 A1* 12/2007 Park ................... B23K 26/0838
                                                       438/458
2017/0162441 A1* 6/2017 Morikazu ........... H01L 33/0095

FOREIGN PATENT DOCUMENTS

JP          10305420 A      11/1998
JP       2004072052 A       3/2004

* cited by examiner

*Primary Examiner* — Michelle Mandala
(74) *Attorney, Agent, or Firm* — Greer Burns & Crain Ltd.

(57) ABSTRACT

An optical device wafer processing method for transferring an optical device layer of an optical device wafer onto a transfer member includes: a dividing groove forming step of forming dividing grooves in a buffer layer; a transfer member joining step of joining the transfer member to a front surface of the optical device layer; and a laser beam applying step of applying a pulsed laser beam from a back surface side of a crystalline substrate. In the laser beam applying step, the buffer layer, or the buffer layer and part of the optical device layer, left without being divided in the dividing groove forming step, are modified in nature.

7 Claims, 7 Drawing Sheets

S20

S30

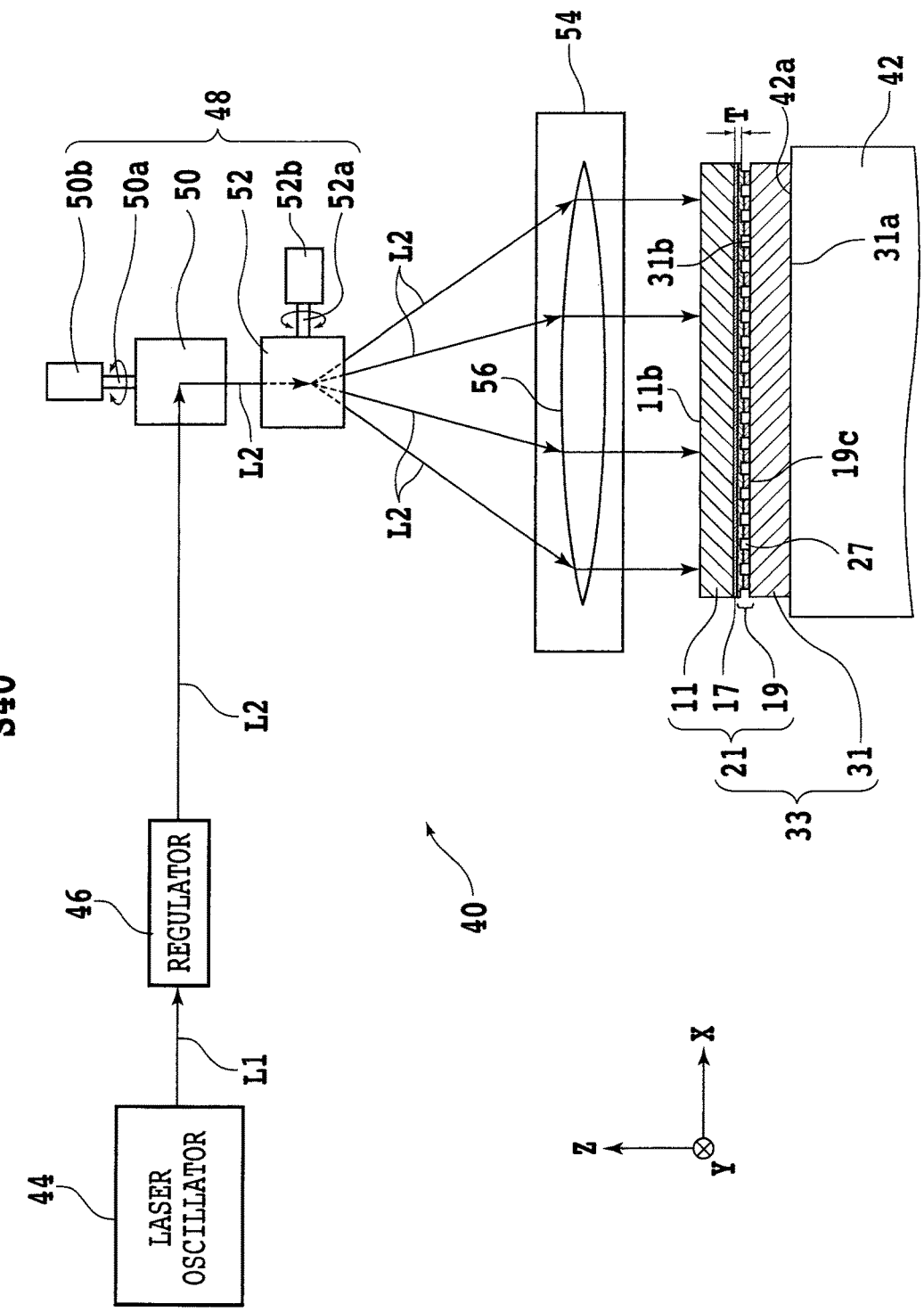

OPTICAL DEVICE WAFER PROCESSING METHOD

BACKGROUND OF THE INVENTION

Field of the Invention

The present invention relates to an optical device wafer processing method for transferring an optical device layer formed in an optical device wafer to a transfer member.

Description of the Related Art

There has been known a technology in which a laser beam is applied to a wafer having an oxide single crystal as a base material along division lines (streets), to divide the wafer (see, for example, Japanese Patent Laid-open No. Hei 10-305420). A plurality of functional devices (for example, optical devices) are provided on a front surface side of the wafer in Japanese Patent Laid-open No. Hei 10-305420, and each of the plurality of functional devices is partitioned by a plurality of intersecting division lines. As an example of the optical devices, a light emitting element such as a light emitting diode (LED) is known. The LED includes, for example, a buffer layer located on a crystalline substrate such as a sapphire substrate or silicon carbide (SiC) substrate, and n-type and p-type semiconductor layers which are located over the buffer layer and which include a semiconductor material such as gallium nitride (GaN) formed by epitaxial growth.

In addition, a cathode is provided in contact with the n-type gallium nitride layer, and an anode is provided in contact with the p-type gallium nitride layer. When a predetermined potential difference is formed between the anode and the cathode, an optical device layer emits light. Incidentally, as a technology for enhancing the luminance of LEDs, there has been known a processing method called a laser lift-off (LLO) method (see, for example, Japanese Patent Laid-open No. 2004-72052). In the LLO method described in Japanese Patent Laid-open No. 2004-72052, first, a gallium nitride-based epitaxial growth layer is formed on a sapphire substrate. Next, a laser beam of such a wavelength as to be transmitted through the sapphire substrate and be absorbed in only the gallium nitride layer located in the vicinity of the interface between the sapphire substrate and the gallium nitride-based epitaxial growth layer is applied, to pyrolyze part of the gallium nitride layer.

The part of the gallium nitride layer thus pyrolyzed becomes nitrogen gas and a metallic gallium layer, and, therefore, the sapphire substrate and the gallium nitride-based epitaxial growth layer are separated, by heating the metallic gallium layer to or above the melting point, or by removing the metallic gallium layer by wet etching. Note that Japanese Patent Laid-open No. 2004-72052 also describes a transfer method for transferring the epitaxial growth layer on the sapphire substrate onto a holding substrate. For example, after a holding substrate formed of silicon (Si) is adhered onto the gallium nitride-based epitaxial growth layer, a laser beam is applied to pyrolyze part of the gallium nitride layer, and to separate the sapphire substrate and the epitaxial growth layer from each other, thereby transferring the epitaxial growth layer onto the transfer member.

By use of the LLO method utilizing a laser beam, it is possible to form a vertical structured LED in which a cathode and an anode are disposed to sandwich both upper and lower surfaces of an optical device layer. The vertical structured LED can realize, for example, a reduction in chip size, uniformization of current distribution, and improvement of heat radiating property, as compared to a horizontal structured LED in which an anode is disposed on a p-type semiconductor layer overlapping with part of an n-type semiconductor layer, and a cathode is disposed on other part of the n-type semiconductor layer not overlapping with the p-type semiconductor layer. As the LLO method, there can be considered a method in which a transfer member is joined to the optical device layer before the optical device layer is divided into the size of LED chips, and a method in which the transfer member is joined to the optical device layer after the optical device layer is divided into the size of LED chips.

SUMMARY OF THE INVENTION

In the case where the transfer member is joined to the optical device layer after the optical device layer is divided into the size of LED chips like the latter method, the laser beam is applied to the whole surface of the interface between the optical device layer and the crystalline substrate. In other words, the laser beam is applied also to a part where the optical device layer is absent. In this case, therefore, there is a problem that chipping and cracking and the like are generated in the optical device layer under the influence of heat or the like.

The present invention has been made in consideration of such a problem as mentioned above. Accordingly, it is an object of the present invention to reduce chipping and cracking and the like which might be generated in an optical device layer, as compared to the case where a transfer member is joined to the optical device layer after the optical device layer is divided into the size of LED chips.

In accordance with an aspect of the present invention, there is provided an optical device wafer processing method for transferring an optical device layer of an optical device wafer onto a transfer member, the optical device layer having an optical device provided in each of a plurality of regions partitioned by a plurality of division lines, the optical device layer stacked over a front surface of a crystalline substrate with a buffer layer therebetween, the optical device wafer processing method including: a dividing groove forming step of forming dividing grooves that do not completely divide the buffer layer of the optical device wafer on the optical device layer side along the division lines; a transfer member joining step of joining the transfer member to a front surface of the optical device layer, after the dividing groove forming step; a laser beam applying step of applying a pulsed laser beam of such a wavelength as to be transmitted through the crystalline substrate and be absorbed in the buffer layer from a back side of the crystalline substrate located at a position on a side opposite to the transfer member of the optical device wafer to which the transfer member has been joined; and a crystalline substrate peeling step of peeling off the crystalline substrate from the optical device layer to transfer the optical device layer onto the transfer member, after the laser beam applying step. In the laser beam applying step, the buffer layer, or the buffer layer and part of the optical device layer, left without being divided in the dividing groove forming step, are modified in nature.

Preferably, in the dividing groove forming step, the dividing grooves are formed by etching, and the optical device wafer processing method further includes, before the dividing groove forming step, a resist film coating step of coating with a resist film a region located on the front surface side of the optical device layer and exclusive of the division lines.

In addition, preferably, a thickness of the buffer layer, or a total thickness of the buffer layer and part of the optical device layer, to which the pulsed laser beam is applied in the laser beam applying step, is not more than 1 μm.

In the dividing groove forming step, the dividing grooves are formed, without completely dividing both the buffer layer and the optical device layer. Then, the buffer layer, or the buffer layer and part of the optical device layer, left without being divided in the dividing groove forming step, are modified in nature in the laser beam applying step. Where the buffer layer, or the buffer layer and part of the optical device layer are thus left without being divided, the influence of heat generated in a laser beam applying step can be reduced, as compared to the case where a laser beam is applied to the whole surface of the interface between the optical device layer and the crystalline substrate after the optical device layer is divided into the size of LED chips. In addition, since the influence of the heat generated in the laser beam applying step can be reduced, chipping and cracking of the finally produced LED chips can be prevented. Therefore, generation of defects in the LED chips can be reduced, and a yield of the LED chips can be enhanced.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 5 is a figure illustrating a laser processing apparatus used in a laser beam applying step (S40)

DETAILED DESCRIPTION OF THE PREFERRED EMBODIMENT

Figure 1A:
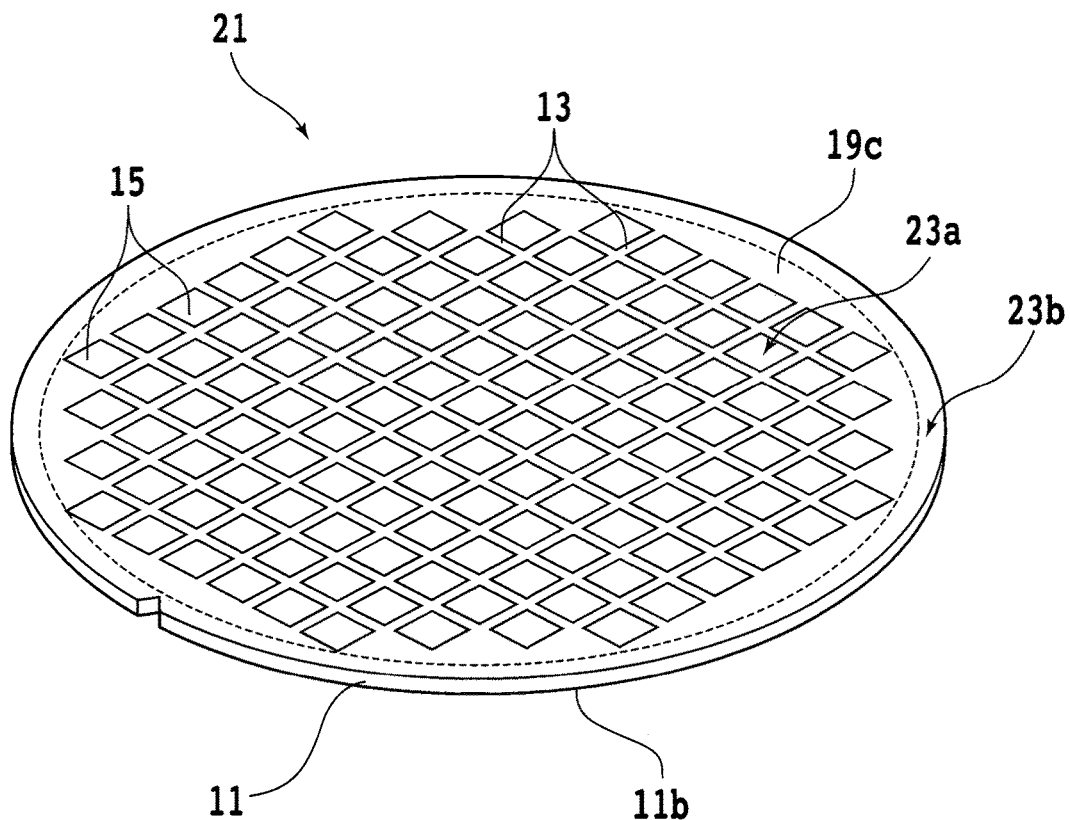
FIG. 1A is a perspective view of an optical device wafer.
Figure 1B:
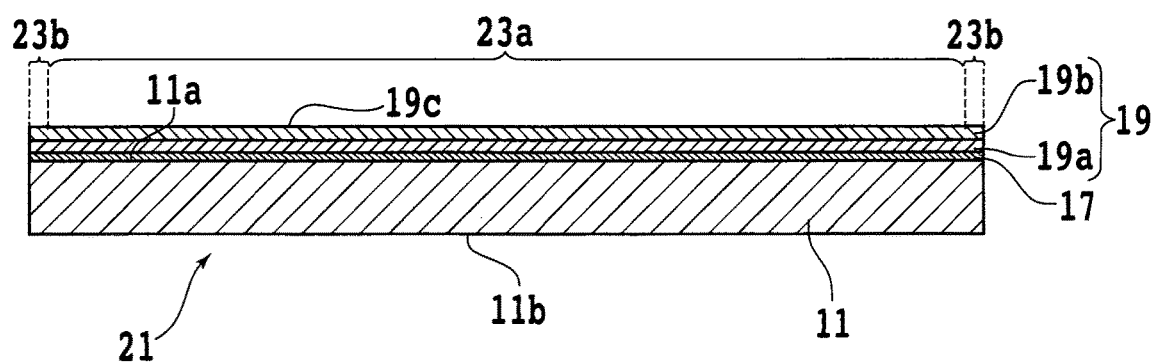
FIG. 1B is a sectional view of the optical device wafer.

An embodiment according to one mode of the present invention will be described referring to the attached drawings. First, an optical device wafer 21 will be described. FIG. 1A is a perspective view of the optical device wafer 21, and FIG. 1B is a sectional view of the optical device wafer 21. The optical device wafer 21 in the present embodiment has a crystalline substrate 11 formed of a single crystal of sapphire. It is to be noted, however, that the material of the crystalline substrate 11 is not limited to the single crystal of sapphire, but may be other material such as GaN and SiC. The crystalline substrate 11 is disk-like in shape, and its thickness from a front surface 11a to a back surface 11b is approximately 300 μm to 1,000 μm. Over the crystalline substrate 11, a buffer layer 17 is provided in contact with the front surface 11a of the crystalline substrate 11. The buffer layer 17 in the present embodiment is a thin film layer which is formed of $Al_xGa_{1-x}N$ ($0 \le x \le 1$) and has a thickness of approximately 300 nm to 1 μm.

The material of the buffer layer 17 is, for example, GaN (x=0), but it may be $Al_xGa_{1-x}N$ (0<x<1), or may be AlN (x=1). Where the buffer layer 17 is provided on the crystalline substrate 11, a crystal layer of higher quality can be epitaxially grown on the crystalline substrate 11, as compared to the case where the buffer layer 17 is not provided. An optical device layer 19 is stacked over the crystalline substrate 11, with the buffer layer 17 therebetween. The optical device layer 19 in the present embodiment is a disk-shaped thin film layer which is formed of GaN formed by an epitaxial growth method and has a thickness of approximately 5 μm to 7 μm. The optical device layer 19 has a p-type GaN layer 19a in contact with a surface of the buffer layer 17 which is on the side opposite to the crystalline substrate 11. The p-type GaN layer 19a includes GaN as a main constituent, and a dopant (for example, magnesium (Mg)) with which GaN is doped and which can function as an acceptor.

In addition, the optical device layer 19 further has an n-type GaN layer 19b in contact with a surface of the p-type GaN layer 19a which is on the side opposite to the buffer layer 17. The n-type GaN layer 19b includes GaN as a main constituent, and a dopant (for example, Si) with which GaN is doped and which can function as a donor. The optical device layer 19 constitutes a light emitting layer of an LED, by pn junction of the p-type GaN layer 19a and the n-type GaN layer 19b. It is to be noted, however, that there is no limitation in regard of the kind, shape, structure, size, layout, etc. of the light emitting layer. The optical device layer 19 may have a clad layer or the like, in addition to the active layer which constitutes the light emitting layer. Besides, a cathode may be provided over the n-type GaN layer 19b.

On the front surface 19c side of the optical device layer 19, a plurality of division lines (streets) 13 each having a predetermined width are set. The width of the division lines 13 is, for example, 5 μm, and each of optical devices 15 partitioned by the plurality of division lines 13 is in a rectangular shape with longer and shorter sides being approximately 10 μm to 20 μm. When the front surface 19c side of the optical device layer 19 is processed (divided) along the division lines 13, the plurality of regions partitioned by the plurality of division lines 13 become a plurality of optical devices 15. The optical devices 15 are each a so-called micro-LED, and, for example, are provided in the number of approximately 2,000,000 in an optical device wafer 21 having a diameter of 2 inches (namely, approximately 5.08 cm). Note that in the present embodiment, a circular region of the optical device layer 19 which is provided with the plurality of optical devices 15 and which is concentric with the crystalline substrate 11 is referred to as a device region 23a. In addition, an annular region on the outer side of the device region 23a is referred to as a peripheral surplus region 23b. In FIG. 1A, the boundary between the device region 23a and the peripheral surplus region 23b is indicated by a broken line.

In the processing method of the present embodiment, first, a resist film 25 (see FIG. 2) is formed on the front surface 19c side of the optical device layer 19 (resist film coating step (S10)). In the resist film coating step (S10), first, the resist film 25 is formed on the front surface 19c of the optical device layer 19 by use of a spin coater. The spin coater has a disk-shaped spin head (not illustrated) of which a surface is fixed horizontally in a rotatable manner. The surface of the spin head is formed with one or more suction holes. In addition, a suction source (not illustrated) is connected to the suction hole or holes of the spin head through a flow path, and, when a negative pressure from the suction source is made to act on the surface of the spin head, a workpiece mounted on the surface of the spin head is held under suction. One end of a rotary shaft (not illustrated) is connected to the spin head, such as to extend downward from the center of the disk-shaped spin head. Besides, a driving motor (not illustrated) is connected to the other end of the rotary shaft, such as to be connected to the spin head through the rotary shaft. In the periphery of the spin head, a scatter preventive wall is provided such as to cover the whole body of the spin head. An opening (not illustrated) is provided on an upper side of the scatter preventive wall, and a nozzle for dropping a mixed liquid prepared by mixing an organic solvent and a photosensitive material (for example, a positive type resist material) or the like is inserted in the opening.

A procedure for forming the resist film 25 will be described. First, the optical device wafer 21 is mounted on the surface of the spin head in such a manner as to locate the optical device layer 19 on an upper side of the optical device wafer 21, and the back surface 11b of the crystalline substrate 11 of the optical device wafer 21 is held under suction onto the spin head by the negative pressure supplied from the suction source. Next, the driving motor is driven to rotate the optical device wafer 21 as one body with the spin head at a high speed. Then, the mixed liquid with the photoresist as a photosensitive material or the like mixed therein is dropped from the nozzle located on the upper side of the optical device wafer 21 onto the front surface 19c of the rotating optical device wafer 21. The mixed liquid is uniformly spread on the front surface 19c of the optical device layer 19 of the optical device wafer 21 by a centrifugal force, whereby a thin film having a thickness of, for example, approximately 1 μm is formed. Thereafter, the thin film is prebaked at a temperature of approximately 80° C. to 150° C., whereby the organic solvent is evaporated off, to form the resist film 25 formed of the photoresist material.

Next, exposure of the resist film 25 is conducted using an exposure apparatus (not illustrated). The exposure apparatus includes, for example, a light source (not illustrated) that emits light of a predetermined wavelength such as ultraviolet rays, and a photomask that permits the light from the light source to be partly transmitted therethrough. The photomask includes, for example, a glass substrate and a chromium film provided on the glass substrate, the chromium film being formed with a predetermined opening pattern by partly removing chromium. The predetermined opening pattern in the present embodiment corresponds to the division lines 13 illustrated in FIG. 1A.

A procedure for exposure of the resist film 25 will be described. First, the optical device wafer 21 formed with the resist film 25 after the prebaking is disposed at a position on the opposite side of the photomask from the light source. Next, the light from the light source is applied to the prebaked resist film 25 through the photomask. Subsequently, the optical device wafer 21 is immersed in a developing liquid, whereby the resist film 25 after exposure is developed. As a result, the exposed portions of the resist film 25 are removed. In the present embodiment, the resist film 25 located on all the division lines 13 is removed, and all the regions on the front surface 19c side of the optical device wafer 21 exclusive of the division lines 13 located on the front surface 19c side are covered with the resist film 25.

Figure 2:
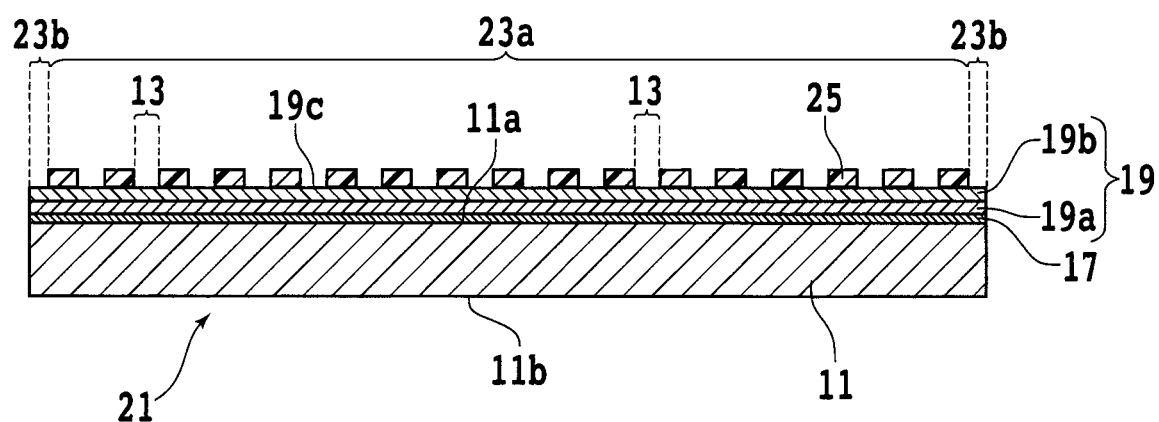
FIG. 2 is a sectional view of an optical device wafer having a resist film formed in a resist film coating step (S10)
Figure 3A:
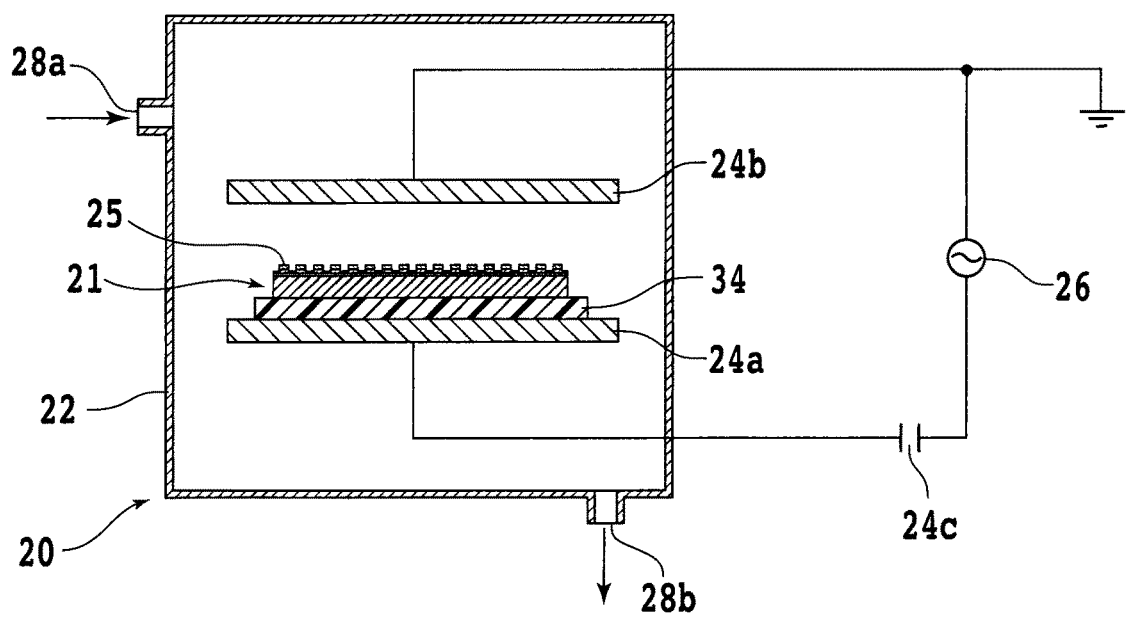
FIG. 3A is a figure illustrating a dry etching apparatus used in a dividing groove forming step (S20)

FIG. 2 is a sectional view of the optical device wafer 21 having the resist film 25 formed in the resist film coating step (S10). As mentioned above, the resist film 25 is patterned such that it is removed on the division lines 13, and, there, the front surface 19c of the optical device wafer 21 is exposed to the exterior. It is to be noted, however, that it is sufficient that the division lines 13 in the device region 23a are exposed from the resist film 25, and the division lines 13 in the peripheral surplus region 23b may be covered with the resist film 25. Next, the optical device layer 19 is partly etched through the patterned resist film 25, to form dividing grooves 27 on the optical device layer 19 side along the division lines 13 (dividing groove forming step (S20)). FIG. 3A is a figure illustrating a dry etching apparatus 20 used in the dividing groove forming step (S20).

In the present embodiment, the dividing grooves 27 are formed in the optical device layer 19 by use of the dry etching apparatus 20. The dry etching apparatus 20 has a vacuum chamber 22 formed of a metal to define a predetermined space. A side wall of the vacuum chamber 22 is provided with a gas introduction port 28a. A first flow path (not illustrated) is connected to the gas introduction port 28a, and the gas introduction port 28a is connected through the first flow path to a gas supply source (not illustrated) having a raw material gas for dry etching. The raw material gas is a chlorine-containing gas such as chlorine ($Cl_2$), boron trichloride ($BCl_3$), and silicon tetrachloride ($SiCl_4$). In addition, a bottom wall of the vacuum chamber 22 is provided with a gas discharge port 28b. A second flow path (not illustrated) is connected to the gas discharge port 28b, and the gas discharge port 28b is connected through the second flow path to an exhaust unit (not illustrated) such as a vacuum pump.

Inside the vacuum chamber 22 are disposed a pair of electrodes (a lower electrode 24a and an upper electrode 24b) which are oppositely provided to face each other in the height direction. The lower electrode 24a is formed in a disk-like shape using a conductive material such as a metal. In the present embodiment, a disk-shaped electrostatic chuck 34 is provided on the lower electrode 24a. The electrostatic chuck 34 is formed mainly from an insulating material, and can attractingly hold the optical device wafer 21 mounted on a flat surface of the electrostatic chuck 34, by an electrostatic force. The lower electrode 24a is electrically connected to one end of a high-frequency power source 26 through a blocking capacitor 24c located in the exterior of the vacuum chamber 22. Specifically, the lower electrode 24a is connected to one end of the blocking capacitor 24c, and the other end of the blocking capacitor 24c is electrically connected to the one end of the high-frequency power source 26. On an upper side of the lower electrode 24a is disposed the upper electrode 24b formed in a disk-like shape using a conductive material such as a metal. Note that in the present embodiment, the upper electrode 24b and the other end of the high-frequency power source 26 are grounded.

The dividing groove forming step (S20) conducted using the dry etching apparatus 20 will be described. First, the optical device wafer 21 provided with the resist film 25 is conveyed into the space of the vacuum chamber 22, and is disposed on the electrostatic chuck 34. Next, the electrostatic chuck 34 is operated, whereby the back surface of the optical device wafer 21 (that is, the back surface 11b of the crystalline substrate 11) is attracted and held by the electrostatic chuck 34. Thereafter, the exhaust unit is operated, to reduce the pressure in the inside space of the vacuum chamber 22. Subsequently, while supplying the raw material gas for dry etching at a predetermined flow rate from the gas supply source into the inside space of the vacuum chamber 22 reduced in pressure, a high-frequency voltage is impressed between the lower electrode 24a and the upper electrode 24b from the high-frequency power source 26.

As a result, a plasma containing radicals, ions or the like is generated between the lower electrode 24a and the upper electrode 24b. Electrons generated in the plasma move faster than the radials, ions or the like other than the electrons, and reach the lower electrode 24a and the upper electrode 24b. Since the upper electrode 24b is grounded, the potential of the upper electrode 24b does not vary even when the electrons reach the upper electrode 24b. However, since the blocking capacitor 24c blocks direct current, the electrons reaching the lower electrode 24a by being attracted by the positive potential of the high-frequency power source 26 are confined and accumulated by the lower electrode 24a. As a result, the lower electrode 24a is charged to be negative (cathode fall). Besides, the plasma and ions or the like of the chlorine-containing gas charged to be positive are attracted by the lower electrode 24a, to reach the optical device layer 19 of the optical device wafer 21.

When the front surface 19c side of the optical device layer 19 not covered with the resist film 25 is exposed to the plasma of the chlorine-containing gas or the like, the regions of the optical device layer 19 corresponding to the division lines 13 react with the plasma or the like of the chlorine-containing gas, and are thereby etched. Thus, reactive ion etching (RIE) is conducted, whereby dividing grooves 27 having a predetermined depth are formed in the optical device layer 19. The depth of the dividing grooves 27 can be controlled, for example, by the supply quantity of the chlorine-containing gas, and the time for which the etching is conducted by generating the plasma or the like of the chlorine-containing gas. After the dividing grooves 27 are formed in the optical device layer 19, the supply of the raw material gas and the impressing of the voltage from the high-frequency power source 26 are stopped. Then, the operation of the exhaust unit is stopped, to return the inside of the vacuum chamber 22 to a normal pressure, after which the optical device wafer 21 is taken out of the vacuum chamber 22. By this, the dividing groove forming step (S20) is finished.

Figure 3B:
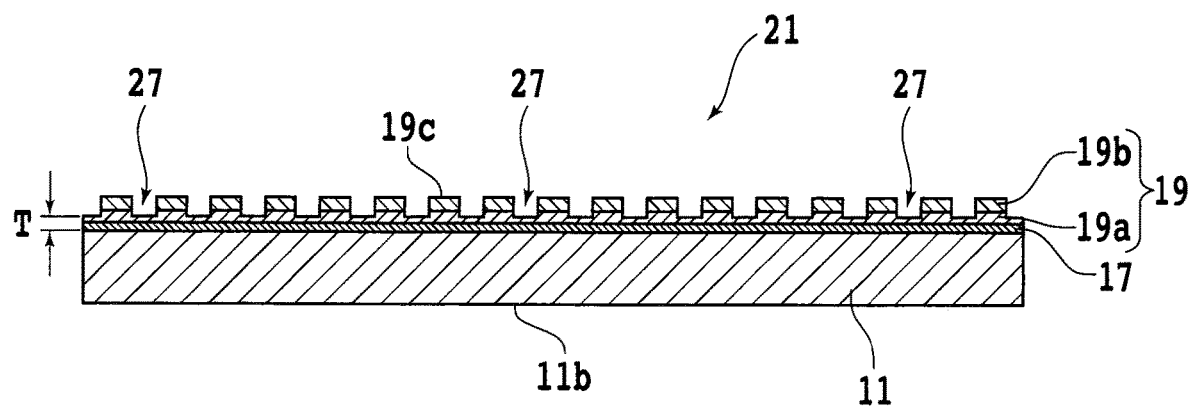
FIG. 3B is a sectional view of the optical device wafer after the dividing groove forming step (S20)

In the dividing groove forming step (S20) of the present embodiment, part of the p-type GaN layer 19a located at positions corresponding to the division lines 13 and the buffer layer 17 are left, whereas the remaining part of the p-type GaN layer 19a and the n-type GaN layer 19b located at positions corresponding to the division lines 13 are removed by the etching. In this way, in the dividing groove forming step (S20), the dividing grooves 27 having such a depth as not to completely divide the optical device layer 19 are formed in the optical device layer 19. In the present embodiment, FIG. 3B is a sectional view of the optical device wafer 21 after the dividing groove forming step (S20). Where the buffer layer 17 and the optical device layer 19 are not divided in the dividing groove forming step (S20) and part of the optical device layer 19 and the buffer layer 17 are left, it is thereby possible to reduce the influence of heat generated in a laser beam applying step (S40) which will be described later. Note that the same effect can be expected also in the case where only the buffer layer 17 is left.

A total thickness T of part of the p-type GaN layer 19a remaining at the positions corresponding to the division lines 13 after the dividing groove forming step (S20) and the buffer layer 17 is, for example, 0.4 µm to 1 µm. The thickness of 0.4 µm is the minimum thickness for reducing the influence of the heat generated in the laser beam applying step (S40) which will be described later. With the thickness T set to be not less than 0.4 µm, the time required for the RIE in the dividing groove forming step (S20) can be shortened, so that productivity of LED chips can be enhanced, as compared to the case where the thickness T is set to be 0 µm, for example. In addition, with the thickness T set to be not more than 1 µm, part of the optical device layer 19 and the buffer layer 17 constituting the thickness T can be securely modified in nature, in the laser beam applying step (S40) which will be described later. If the thickness T is set to be more than 1 µm, it would be impossible to securely modify, in nature, the remaining part of the optical device layer 19 and the buffer layer 17, in the laser beam applying step (S40) which will be described later. Therefore, it is desirable to set the thickness T to be not more than 1 µm.

Note that while part of the optical device layer 19 and the buffer layer 17 are left in the dividing groove forming step (S20) of the present embodiment, the dividing grooves 27 may penetrate the optical device layer 19 and reach the buffer layer 17. In this case, the optical device layer 19 does not remain on the crystalline substrate 11 side of the dividing grooves 27, and only the buffer layer 17 remains. It is to be noted, however, that even in the case where only the buffer layer 17 is left, it is desirable that the thickness of the buffer layer 17 is 0.4 µm to 1 µm. With the thickness T set to be not less than 0.4 µm, it is possible, as mentioned above, to reduce the influence of the heat generated in the laser beam applying step (S40), and to shorten the time required for the RIE. With the thickness T set to be not more than 1 µm, modification in nature can be securely achieved by the laser beam, as mentioned above.

Figure 4:
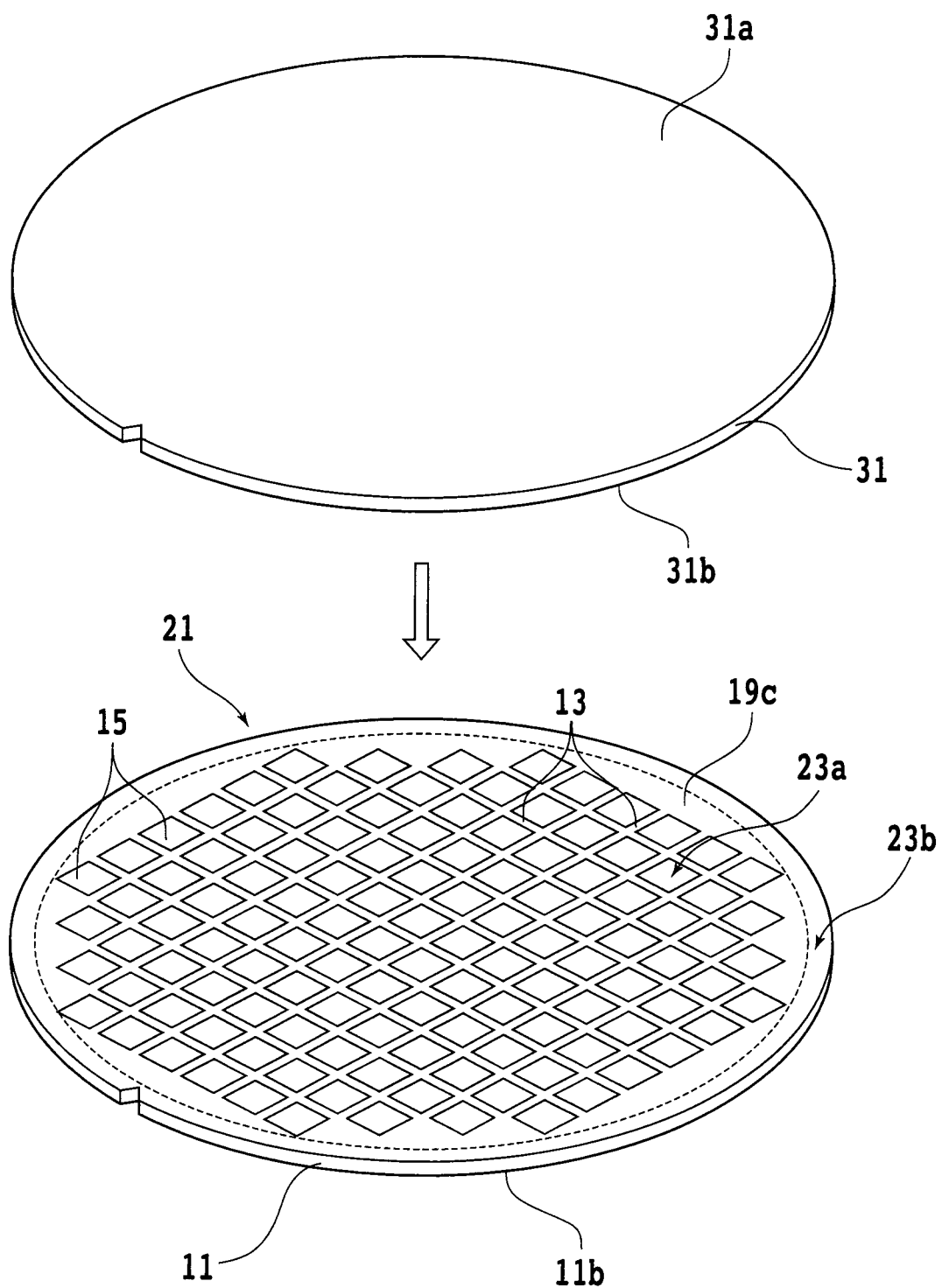
FIG. 4 is a figure illustrating a transfer member joining step (S30)

After the dividing groove forming step (S20), a transfer member 31 is joined to the front surface 19c of the optical device layer 19 (transfer member joining step (S30)). FIG. 4 is a figure illustrating the transfer member joining step (S30). The transfer member 31 is a disk-shaped substrate which is substantially the same as the optical device wafer 21, and is formed, for example, of a metal such as molybdenum (Mo) and copper (Cu) or a semiconductor such as Si. In the transfer member joining step (S30), first, a joining metal layer having a thickness of several micrometers is formed on a back surface 31b of the transfer member 31. The joining metal layer is formed, for example, of a metal such as gold (Au), platinum (Pt), chromium (Cr), indium (In), and palladium (Pd).

After the joining metal layer is formed on the back surface 31b of the transfer member 31, the back surface 31b of the transfer member 31 is pressed against the front surface 19c of the optical device layer 19 by a predetermined force. As a result, the back surface 31b of the transfer member 31 is pressure joined to the optical device layer 19, to form a composite substrate 33 in which the front surface 19c of the optical device layer 19 and the back surface 31b of the transfer member 31 are joined to each other through the joining metal layer. After the composite substrate 33 is formed, the transfer member joining step (S30) is finished. Note that while the joining metal layer is formed on the back surface 31b of the transfer member 31 in the present embodiment, the joining metal layer may be formed on the front surface 19c of the optical device layer 19, instead of the back surface 31b of the transfer member 31. At the time of pressure joining, the optical device layer 19 or the transfer member 31 may be heated to around a temperature at which the joining metal layer melts.

After the transfer member joining step (S30), a pulsed laser beam is applied from the back surface 1ib side of the crystalline substrate 11 (laser beam applying step (S40)). FIG. 5 is a figure illustrating a laser processing apparatus 40 used in the laser beam applying step (S40). Note that in FIG. 5, some of component elements are depicted in functional blocks. The laser processing apparatus 40 includes a chuck table 42 that holds the composite substrate 33 by suction. The chuck table 42 is linked to a rotating mechanism (not illustrated) such as a motor, and is rotatable around a rotational axis substantially parallel to a Z-axis direction. In addition, a table moving mechanism (not illustrated) is provided under the chuck table 42, and the chuck table 42 can be moved in an X-axis direction (processing feeding direction) and a Y-axis direction (indexing feeding direction) by the table moving mechanism.

Part of an upper surface of the chuck table 42 is a holding surface 42a for holding under suction the front surface 31a side of the transfer member 31 of the composite substrate 33. Note that the X axis and the Y axis in the present embodiment are parallel to the holding surface 42a of the chuck table 42, whereas the Z axis is perpendicular to the holding surface 42a. The holding surface 42a of the chuck table 42 is connected to a suction source (not illustrated) disposed at a lower portion of the chuck table 42, through a suction passage (not illustrated) and the like formed inside the chuck table 42. Where a negative pressure of the suction source is made to act on the holding surface 42a, the transfer member 31 of the composite substrate 33 is thereby held under suction onto the chuck table 42.

In addition, the laser processing apparatus 40 includes a laser oscillator 44 in which a rod-shaped neodymium-doped yttrium aluminum garnet (Nd:YAG) is used as a laser medium. The laser oscillator 44 in the present embodiment emits to the exterior a pulsed laser beam L1 having a wavelength of 1,064 nm. The pulsed laser beam L1 emitted from the laser oscillator 44 is incident on a regulator 46 disposed adjacently to the laser oscillator 44. The regulator 46 includes, for example, a plurality of wavelength converting crystals, and has a function of converting the frequency of the pulsed laser beam L1 to an integer times the original. The regulator 46 in the present embodiment includes a first wavelength converging crystal on which the pulsed laser beam L1 emitted from the laser oscillator 44 is incident, and a second wavelength converting crystal on which the pulsed laser beam emitted from the first wavelength converting crystal is incident.

The first wavelength converting crystal converts the frequency of the pulsed laser beam L1 to two times (that is, the second harmonic of the pulsed laser beam L1). In addition, the second wavelength converting crystal converts the frequency of the pulsed laser beam emitted from the first wavelength converting crystal to two times (that is, the fourth harmonic of the pulsed laser beam L1), and emits it as a second pulsed laser beam L2. Thus, the regulator 46 converts the pulsed laser beam L1 having a wavelength of 1,064 nm into the pulsed laser beam L2 having a wavelength of 266 nm. The pulsed laser beam L2 is transmitted through the crystalline substrate 11 (namely, it has a property of being transmittable through the crystalline substrate 11), but is absorbed in the buffer layer 17 and the optical device layer 19 (namely, it has a property of being absorbable in the buffer layer 17 and the optical device layer 19).

Note that applying conditions of the pulsed laser beam L2 in the present embodiment were set as follows.

Repetition frequency: 50 kHz to 200 kHz
Pulse energy: 0.5 µJ to 10 µJ
Average output: 0.1 W to 2 W
Pulse width: 1 ps to 20 ps
Spot diameter: 10 µm to 50 µm The pulsed laser beam L2 with the wavelength regulated by the regulator 46 is incident on a Galvano scanner 48. The Galvano scanner 48 includes an X scan mirror 50 that reflects the pulsed laser beam L2. The X scan mirror 50 moves the reflected pulsed laser beam L2 along the X-axis direction. The X scan mirror 50 is connected to one end of a first rotary shaft 50a. The first rotary shaft 50a is a shaft along a direction orthogonal to the X-axis direction (in the present embodiment, the Z-axis direction), and the other end of the first rotary shaft 50a is connected to a first motor 50b.

The first motor 50b rotates the first rotary shaft 50a at a high speed in such a manner as to reciprocate in a predetermined angular range, whereby the pulsed laser beam L2 reflected by the X scan mirror 50 can be moved at a high speed along the X-axis direction. Note that driving of the first motor 50b is controlled by a control driver (not illustrated). The pulsed laser beam L2 reflected from the X scan mirror 50 is incident on a Y scan mirror 52. The Y scan mirror 52 is connected to one end of a second rotary shaft 52a. The second rotary shaft 52a is a shaft along a direction orthogonal to the Y-axis direction (in the present embodiment, the X-axis direction), and the other end of the second rotary shaft 52a is connected to a second motor 52b.

The second motor 52b rotates the second rotary shaft 52a at a high speed in such a manner as to reciprocate in a predetermined angular range, whereby the pulsed laser beam L2 reflected by the Y scan mirror 52 can be moved at a high speed along the Y-axis direction. Note that driving of the second motor 52b is also controlled by the control driver. The pulsed laser beam L2 reflected by the Y scan mirror 52 is incident on a focusing device 54. The focusing device 54 has a telecentric fθ lens 56, and the pulsed laser beam L2 transmitted through the telecentric fθ lens 56 goes out toward the composite substrate 33 perpendicularly to the back surface 11b of the crystalline substrate 11.

In the laser beam applying step (S40), first, the front surface 31a side of the transfer member 31 is mounted on the holding surface 42a. Next, a negative pressure of the suction source is made to act, to hold under suction the composite substrate 33 by the holding surface 42a. In this instance, the back surface 11b side of the crystalline substrate 11 located on the opposite side of the optical device wafer 21, to which the transfer member 31 has been joined, from the transfer member 31 is in the state of being exposed to the upper side. Next, the pulsed laser beam L1 is emitted from the laser oscillator 44. The pulsed laser beam L1 is converted into the pulsed laser beam L2 by the regulator 46, and, further, is reflected by the Galvano scanner 48. The pulsed laser beam L2 reflected by the Galvano scanner 48 is perpendicularly incident on the back surface 11b of the crystalline substrate 11 through the telecentric fθ lens 56.

The Galvano scanner 48 reflects the pulsed laser beam L2 in such a manner as to scan an X-Y plane with the pulsed laser beam L2. The Galvano scanner 48, for example, moves a spot of the pulsed laser beam L2 at a moving velocity of 50 to 100 mm/s in such a manner as to draw a spiral from the center of the X-Y plane toward the outside. The pulsed laser beam L2 is absorbed in the buffer layer 17 and part of the optical device layer 19 constituting the thickness T while remaining without being divided in the dividing groove forming step (S20), whereby the buffer layer 17 and part of the optical device layer 19 are modified in nature. Note that in the present embodiment, the buffer layer 17 and part of the optical device layer 19 modified in nature in the laser beam applying step (S40) may be referred to as a peeling layer. In the present embodiment, since the peeling layer is formed by the pulsed laser beam L2, the time required for etching in the dividing groove forming step (S20) can be shortened, and productivity of LED chips can be enhanced.

In the present embodiment in which the buffer layer 17 and the optical device layer 19 are formed of GaN, the GaN modified in nature by the pulsed laser beam L2 is separated, for example, into a gallium (Ga) metal layer and nitrogen ($N_2$) gas. Thus, with the pulsed laser beam L2 applied to GaN, the GaN is broken. Note that in the case where part of the optical device layer 19 is not left in contact with the crystalline substrate 11 side of the dividing grooves 27 formed in the dividing groove forming step (S20) and only the buffer layer 17 remains, only the buffer layer 17 may be modified in nature (or broken) by the pulsed laser beam L2 in the laser beam applying step (S40). As mentioned above, in the laser beam applying step (S40) of the present embodiment, the influence of heat generated in the buffer layer 17 or in the buffer layer 17 and part of the optical device layer 19 can be reduced. In addition, since the influence of the heat can be reduced, chipping and cracking of the finally produced LED chips can be prevented.

Figure 6A:
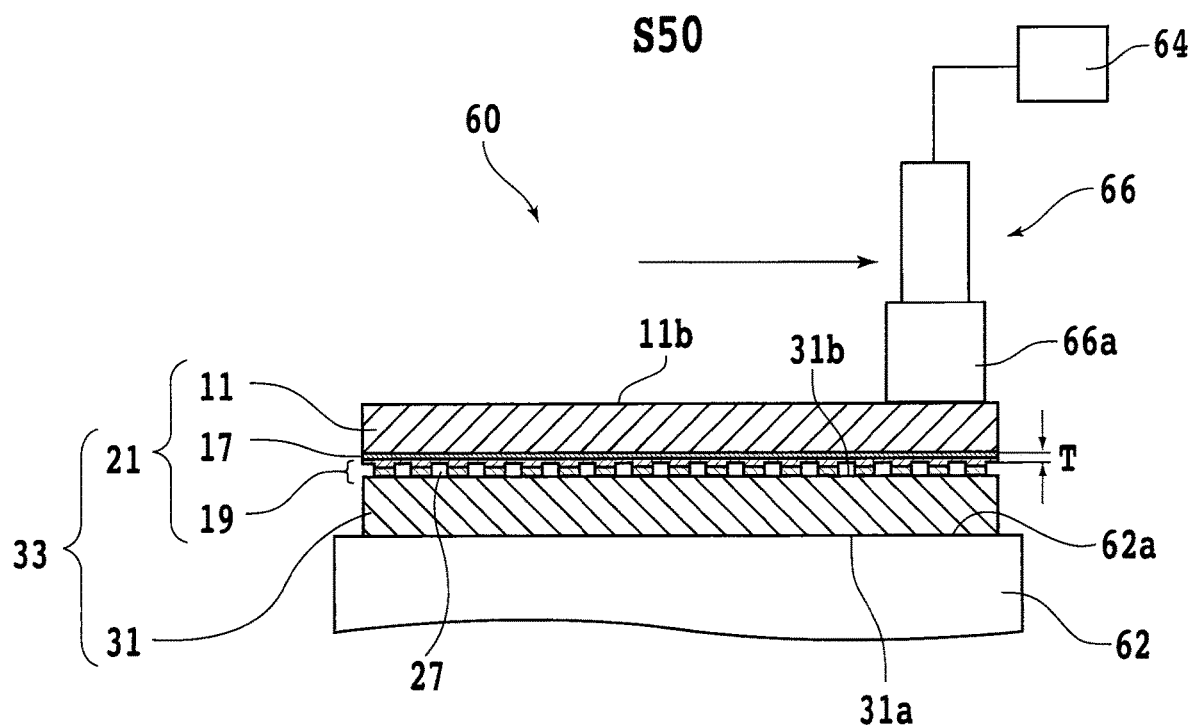
FIG. 6A is a figure illustrating a crystalline substrate peeling step (S50)

After the laser beam applying step (S40), the crystalline substrate 11 is peeled off from the optical device layer 19 and the optical device layer 19 is transferred onto the transfer member 31 (crystalline substrate peeling step (S50)). FIG. 6A is a figure illustrating the crystalline substrate peeling step (S50). In the crystalline substrate peeling step (S50), the crystalline substrate 11 is peeled off from the optical device layer 19 by use of a peeling apparatus 60. The peeling apparatus 60 in the present embodiment includes a chuck table 62 that holds under suction the front surface 31*a* of the transfer member 31 by a holding surface 62*a*. The structure of the chuck table 62 is the same as that of the chuck table 42 described above, and, therefore, detailed description thereof is omitted here.

In addition, the peeling apparatus 60 includes an oscillator 64 that generates an ultrasonic vibration, and an ultrasonic horn 66 of which one end is connected to the oscillator 64. The ultrasonic vibration generated in the oscillator 64 is resonated at the ultrasonic horn 66, and is transmitted to a tip 66*a* of the ultrasonic horn 66 located on a side opposite to the one end connected to the oscillator 64. When the tip 66*a* of the ultrasonic horn 66 is put in contact with the back surface 11*b* of the crystalline substrate 11 in a state in which the ultrasonic vibration is generated by the oscillator 64, the ultrasonic wave is transmitted from the tip 66*a* to the peeling layer formed in the aforementioned laser beam applying step (S40). The ultrasonic wave has a frequency of, for example, 20 kHz to 100 kHz. When the ultrasonic wave is applied to the peeling layer, the joining state between the crystalline substrate 11 and the optical device layer 19 is canceled, and the crystalline substrate 11 becomes easily separable from the optical device layer 19.

The peeling apparatus 60 further includes a conveying arm (not illustrated) for pulling up the crystalline substrate 11 after the joining state between the crystalline substrate 11 and the optical device layer 19 is canceled. A suction pad (not illustrated) is provided at a tip of the conveying arm, and the suction pad can suction hold the back surface 11*b* of the crystalline substrate 11, by causing a negative pressure of a vacuum source (not illustrated) to act on a pad surface located at the tip thereof. In the crystalline substrate peeling step (S50), first, the front surface 31*a* side of the transfer member 31 is mounted on the holding surface 62*a*. Next, the negative pressure of the suction source is made to act, whereby the front surface 31*a* side of the transfer member 31 is held under suction by the holding surface 62*a*. Subsequently, the tip 66*a* of the ultrasonic horn 66, with the ultrasonic vibration generated by the oscillator 64, is put in contact with the back surface 11*b* of the crystalline substrate 11. Then, the tip 66*a* of the ultrasonic horn 66 is moved at least one round along the outer periphery of the circular back surface 11*b* of the crystalline substrate 11. It is to be noted, however, that the tip 66*a* may be moved along the whole surface of the back surface 11*b*.

Figure 6B:
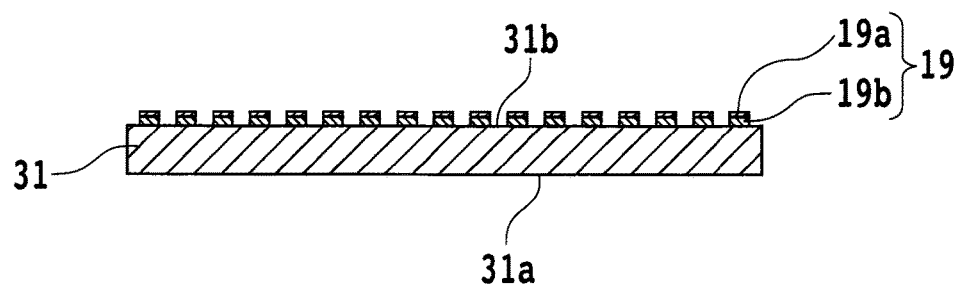
FIG. 6B is a sectional view of an optical device layer and a transfer member after the crystalline substrate peeling step (S50)
Figure 7:
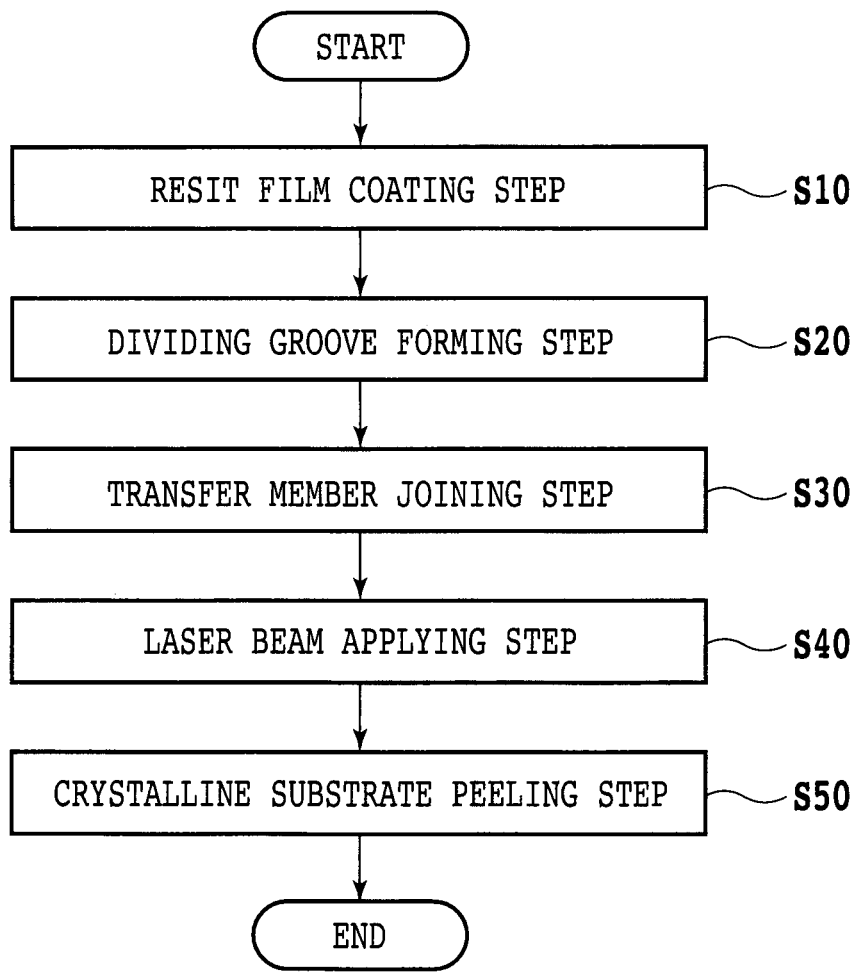
FIG. 7 is a flow chart illustrating an optical device wafer processing method according to a mode of the present invention.

Next, the back surface 11*b* of the crystalline substrate 11 is held under suction by use of the suction pad of the conveying arm. With the conveying arm pulled up, the crystalline substrate 11 is peeled off from the optical device layer 19. By this, the crystalline substrate peeling step (S50) for transferring the optical device layer 19 onto the transfer member 31 is finished. FIG. 6B is a sectional view of the optical device layer 19 and the transfer member 31 after the crystalline substrate peeling step (S50). FIG. 7 is a flow chart illustrating a processing method for the optical device wafer 21 according to one mode of the present invention. As mentioned above, in the present embodiment, steps ranging from the resist coating step (S10) to the crystalline substrate peeling step (S50) are sequentially carried out. In the present embodiment, the buffer layer 17, or the buffer layer 17 and part of the optical device layer 19 are left without being divided in the dividing groove forming step (S20), and, therefore, the influence of the heat generated in the buffer layer 17 or in the buffer layer 17 and part of the optical device layer 19 in the laser beam applying step (S40) can be reduced. Accordingly, generation of defects in LED chips can be reduced, and the yield of the LED chips can be enhanced.

The structures, methods and the like according to the present embodiment may be modified appropriately, insofar as the modifications do not depart from the scope of the object of the present invention. For instance, the stacking order of the p-type GaN layer 19*a* and the n-type GaN layer 19*b* may be reversed. In other words, the n-type GaN layer 19*b* may be formed in contact with the buffer layer 17, and the p-type GaN layer 19*a* may be formed in contact with the n-type GaN layer 19*b*. In addition, the dividing grooves 27 may be formed by applying a laser beam of such a wavelength as to be absorbed in the optical device layer 19 to the front surface 19*c* of the optical device layer 19 along the division lines 13, without passing through the resist film coating step (S10). Further, a protective tape may be adhered to the front surface 31*a* side of the transfer member 31 in the composite substrate 33. The composite substrate 33 may be held under suction by the holding surface 42*a* of the chuck table 42 or by the holding surface 62*a* of the chuck table 62, with the protective tape therebetween.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An optical device wafer processing method for transferring an optical device layer of an optical device wafer onto a transfer member, the optical device layer having an optical device provided in each of a plurality of regions partitioned by a plurality of division lines, the optical device layer stacked over a front surface of a crystalline substrate with a buffer layer therebetween, the optical device wafer processing method comprising:
- a dividing groove forming step of forming dividing grooves along the plurality of division lines without completely dividing the buffer layer of the optical device wafer on the optical device layer side along formed dividing grooves;
- a transfer member joining step of joining the transfer member to a front surface of the optical device layer, after the dividing groove forming step;
- a laser beam applying step of applying a pulsed laser beam of such a wavelength as to be transmitted through the crystalline substrate and be absorbed in the buffer layer from a back side of the crystalline substrate located at a position on a side opposite to the transfer member of the optical device wafer to which the transfer member has been joined; and
- a crystalline substrate peeling step of peeling off the crystalline substrate from the optical device layer to transfer the optical device layer onto the transfer member, after the laser beam applying step, wherein in the laser beam applying step, the buffer layer, or the buffer layer and part of the optical device layer, left without being divided in the dividing groove forming step, are modified in nature.

2. The optical device wafer processing method according to claim 1,
wherein in the dividing groove forming step, the dividing grooves are formed by etching, and
the optical device wafer processing method further comprises, before the dividing groove forming step, a resist film coating step of coating with a resist film a region located on the front surface side of the optical device layer and exclusive of the division lines.

3. The optical device wafer processing method according to claim 1, wherein a thickness of the buffer layer, or a total thickness of the buffer layer and part of the optical device layer, to which the pulsed laser beam is applied in the laser beam applying step, is not more than 1 μm.

4. The optical device wafer processing method according to claim 1, wherein the laser beam is moved in a spiral direction from a center of an X-Y plane of the optical device wafer to an outside of the X-Y plane of the optical device wafer.

5. The optical device wafer processing method according to claim 4, wherein the laser beam is applied by a Galvano scanner including a first motor for moving the laser beam along an X-axis direction and a second motor for moving the laser beam along a Y-axis direction.

6. The optical device wafer processing method according to claim 1, wherein the peeling step includes applying an ultrasonic wave to the crystalline substrate to separate the crystalline substrate from the optical device layer.

7. The optical device wafer processing method according to claim 6, wherein the ultrasonic wave is generated by an oscillator for generating an ultrasonic vibration, an ultrasonic horn for resonating the ultrasonic vibration generated by the oscillator, the ultrasonic horn including a tip configured to come in contact with the crystalline substrate and apply the ultrasonic wave from the resonated ultrasonic vibration.

* * * * *